(12) United States Patent
Unterburger

(10) Patent No.: US 10,903,406 B2
(45) Date of Patent: Jan. 26, 2021

(54) HOUSING COMPRISING A SEMICONDUCTOR BODY AND A METHOD FOR PRODUCING A HOUSING WITH A SEMICONDUCTOR BODY

(71) Applicant: OSRAM OLED GmbH, Regensburg (DE)

(72) Inventor: Martin Unterburger, Sünching (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/747,447

(22) PCT Filed: Jul. 20, 2016

(86) PCT No.: PCT/EP2016/067316
§ 371 (c)(1),
(2) Date: Jan. 25, 2018

(87) PCT Pub. No.: WO2017/016957
PCT Pub. Date: Feb. 2, 2017

(65) Prior Publication Data
US 2018/0219145 A1 Aug. 2, 2018

(30) Foreign Application Priority Data
Jul. 28, 2015 (DE) .......... 10 2015 214 219

(51) Int. Cl.
*H01L 33/62* (2010.01)
*H01L 33/48* (2010.01)
(Continued)

(52) U.S. Cl.
CPC ............ *H01L 33/62* (2013.01); *H01L 21/561* (2013.01); *H01L 21/568* (2013.01);
(Continued)

(58) Field of Classification Search
CPC ....... H01L 33/62; H01L 33/44; H01L 33/647; H01L 33/486; H01L 33/54; H01L 21/561;
(Continued)

(56) References Cited

U.S. PATENT DOCUMENTS

| 5,981,314 A | 11/1999 | Glenn et al. |
| 6,475,877 B1 | 11/2002 | Saia et al. |

(Continued)

FOREIGN PATENT DOCUMENTS

| DE | 102007030129 A1 | 1/2009 |
| DE | 102009036621 A1 | 2/2011 |

(Continued)

OTHER PUBLICATIONS

International Search Report based on application No. PCT/EP2016/067316 (4 pages and 3 pages of English translation) dated Sep. 28, 2016 (Reference Purpose Only).

(Continued)

*Primary Examiner* — Laura M Menz
*Assistant Examiner* — Candice Chan
(74) *Attorney, Agent, or Firm* — Viering, Jentschura & Partner MBB

(57) ABSTRACT

A method for producing a component having a semiconductor body includes providing the semiconductor body including a radiation passage surface and a rear side facing away from the radiation passage surface, wherein the semiconductor body comprises on the rear side a connection location for the electrical contacting of the semiconductor body, providing a composite carrier including a carrier layer and a partly cured connecting layer, applying the semiconductor body on the composite carrier, such that the connection location penetrates into the partly cured connecting layer, curing the connecting layer to form a solid composite, applying a molded body material on the composite carrier
(Continued)

after curing the connecting layer, wherein the molded body covers side surfaces of the semiconductor body, forming a cutout through the carrier layer and the connecting layer in order to expose the connection location, and filling the cutout with an electrically conductive material.

7 Claims, 4 Drawing Sheets

(51) Int. Cl.
    *H01L 33/54*     (2010.01)
    *H01L 21/56*     (2006.01)
    *H01L 21/683*    (2006.01)
    *H01L 23/00*     (2006.01)
    *H01L 33/44*     (2010.01)
    *H01L 33/64*     (2010.01)

(52) U.S. Cl.
    CPC .......... *H01L 21/6835* (2013.01); *H01L 24/13* (2013.01); *H01L 33/44* (2013.01); *H01L 33/486* (2013.01); *H01L 33/54* (2013.01); *H01L 33/647* (2013.01); *H01L 24/24* (2013.01); *H01L 24/82* (2013.01); *H01L 2221/68359* (2013.01); *H01L 2221/68377* (2013.01); *H01L 2224/04105* (2013.01); *H01L 2224/1163* (2013.01); *H01L 2224/11602* (2013.01); *H01L 2224/12105* (2013.01); *H01L 2224/13147* (2013.01); *H01L 2224/19* (2013.01); *H01L 2224/2402* (2013.01); *H01L 2224/82101* (2013.01); *H01L 2224/82106* (2013.01); *H01L 2924/18162* (2013.01); *H01L 2933/005* (2013.01); *H01L 2933/0025* (2013.01); *H01L 2933/0066* (2013.01); *H01L 2933/0075* (2013.01)

(58) Field of Classification Search
    CPC ... H01L 21/568; H01L 21/6835; H01L 24/13; H01L 24/82; H01L 24/24; H01L 2221/68359; H01L 2224/04105; H01L 2924/18162; H01L 2933/005; H01L 2221/68377; H01L 2224/11602; H01L 2224/1163; H01L 2224/12105; H01L 2224/13147; H01L 2224/2402; H01L 2224/82101; H01L 2224/82106; H01L 2933/0075; H01L 2933/0025; H01L 2933/0066; H01L 2224/19
    See application file for complete search history.

(56) References Cited

U.S. PATENT DOCUMENTS

| | | |
|---|---|---|
| 2002/0096994 A1 | 7/2002 | Iwafuchi et al. |
| 2002/0197767 A1 | 12/2002 | Saia et al. |
| 2005/0211997 A1 | 9/2005 | Suehiro et al. |
| 2006/0278967 A1 | 12/2006 | Tuominen et al. |
| 2010/0140640 A1* | 6/2010 | Shimokawa ........ H01L 33/0079 257/98 |
| 2010/0276706 A1 | 11/2010 | Herrmann |
| 2012/0119233 A1 | 5/2012 | Weidner et al. |
| 2012/0241792 A1 | 9/2012 | Obata et al. |
| 2012/0305969 A1 | 12/2012 | Sato et al. |
| 2013/0026518 A1 | 1/2013 | Suh et al. |
| 2014/0061682 A1 | 3/2014 | Kobayashi et al. |
| 2014/0374779 A1 | 12/2014 | Chung et al. |
| 2015/0050760 A1 | 2/2015 | Imazu et al. |
| 2015/0221842 A1 | 8/2015 | Mima et al. |
| 2015/0325760 A1 | 11/2015 | Suenaga et al. |
| 2016/0005936 A1 | 1/2016 | Illek et al. |
| 2016/0093783 A1 | 3/2016 | Singer et al. |
| 2017/0288108 A1 | 10/2017 | Schumann et al. |

FOREIGN PATENT DOCUMENTS

| | | |
|---|---|---|
| DE | 102010046257 A1 | 3/2012 |
| DE | 102013202906 A1 | 8/2014 |
| DE | 102013206225 A1 | 10/2014 |
| DE | 102014108570 A1 | 12/2014 |
| DE | 102014112540 A1 | 3/2016 |
| EP | 2221885 A1 | 8/2010 |
| EP | 2804225 A1 | 11/2014 |
| JP | 2001217338 A | 8/2001 |
| JP | 2001250888 A | 9/2001 |
| JP | 2001274313 A | 10/2001 |
| JP | 2002084004 A | 3/2002 |
| JP | 2002261335 A | 9/2002 |
| JP | 2005039177 A | 2/2005 |
| JP | 2006523375 A | 10/2006 |
| JP | 2011003626 A | 1/2011 |
| JP | 2012212871 A | 11/2012 |
| JP | 2012251031 A | 12/2012 |
| JP | 2013012544 A | 1/2013 |
| JP | 2013501368 A | 1/2013 |
| JP | 2014127933 A | 7/2014 |
| JP | 2014241400 A | 12/2014 |
| WO | 2013137356 A1 | 9/2013 |
| WO | 2014097645 A1 | 6/2014 |

OTHER PUBLICATIONS

Notice of Refusal issued for corresponding application No. 2018-504259, dated Feb. 25, 2019, 4 pages and 5 pages translation (for informational purpose only).

Japanese Search Report by Registered Search Organization based on Application No. 2018504259 (report and translation, 42 pages) dated Jan. 1, 2019 (for reference purpose only).

Japanese Notice of Reasons for Refusal based on Application No. 2018504259 (5 pages) dated Feb. 25, 2019 (for reference purpose only).

* cited by examiner

FIG 1
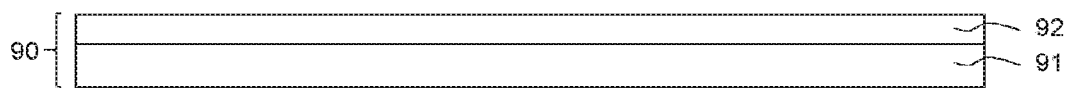
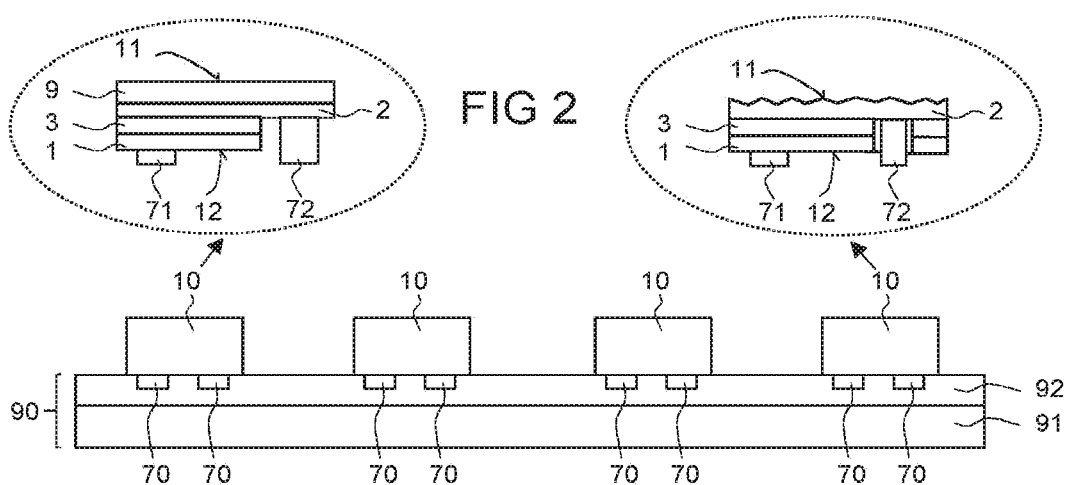
FIG 2
FIG 3
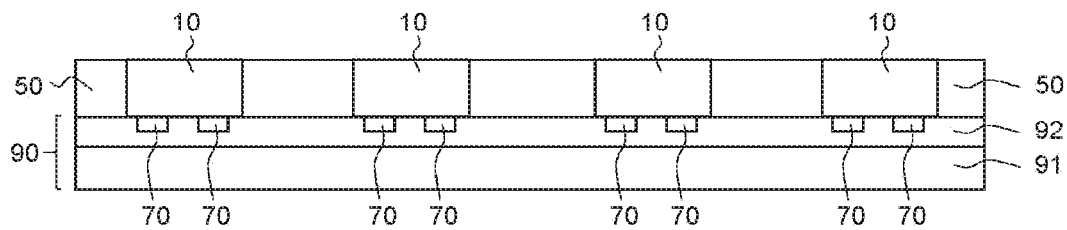

HOUSING COMPRISING A SEMICONDUCTOR BODY AND A METHOD FOR PRODUCING A HOUSING WITH A SEMICONDUCTOR BODY

RELATED APPLICATIONS

The present application is a national stage entry according to 35 U.S.C. § 371 of PCT application No.: PCT/EP2016/067316 filed on Jul. 20, 2016, which claims priority from German application No.: 10 2015 214 219.1 filed on Jul. 28, 2015, and is incorporated herein by reference in its entirety.

TECHNICAL FIELD

A method for producing a component and a component are specified.

BACKGROUND

When forming a housing directly on a semiconductor chip, difficulties often occur in respect of the semiconductor chip not being sufficiently fixed for instance during a molding method, or in respect of a housing material not adhering sufficiently to side surfaces of the semiconductor chip on account of a high concentration of impurity particles contained in the housing material. Moreover, the finished produced component often detrimentally exhibits an inadequate heat dissipation from the semiconductor chip and potential weak points regarding mechanical connections between contact structures of the semiconductor chip and contact structures of the housing.

SUMMARY

One object is to specify a simplified and at the same time efficient method for producing one component or a plurality of components. A further object is to specify a component producible in a simplified manner and having a high mechanical stability.

In accordance with at least one embodiment of a method for producing a component, a semiconductor body is provided. The semiconductor body can be part of a semiconductor chip in an early method stage. The semiconductor chip is preferably a sapphire semiconductor chip including a semiconductor body, which is arranged on a sapphire substrate and/or is epitaxially deposited onto a sapphire substrate for instance by a coating method. In particular, the semiconductor chip in the early method stage is free of a housing. Moreover, the semiconductor chip can be free of a carrier which is not removed from the semiconductor body for instance during a subsequent method step and in particular is different than a growth substrate. A plurality of such semiconductor bodies can also be provided. The semiconductor body can also be part of a semiconductor composite, wherein the semiconductor composite can be singulated into a plurality of semiconductor bodies in a later method step.

The semiconductor body includes a radiation passage surface and a rear side facing away from the radiation passage surface. A radiation passage surface is understood to mean a surface through which electromagnetic radiation passes before it is coupled out from the component or is absorbed by the component. If the semiconductor body is arranged for instance on a radiation-transmissive substrate, for example on a sapphire substrate, the rear side of the semiconductor body can likewise be formed as a radiation passage surface. However, this does not mean that in this case electromagnetic radiation is coupled in or out exclusively through the radiation passage surface. Rather, it is also possible for the semiconductor body to include side surfaces through which electromagnetic radiation can pass. The radiation passage surface and/or the rear side of the semiconductor body can each be a surface of a semiconductor layer of the semiconductor body or for instance of a further layer arranged on the semiconductor body. The semiconductor body includes in particular on the rear side one or a plurality of connection locations for the electrical contacting of the semiconductor body. The connection locations can be for instance parts of connection layers which project beyond the rear side, wherein the connection layers can extend into the semiconductor body. In particular, the semiconductor body includes on the rear side at least two connection locations which are spaced apart from one another, are assigned to different electrical polarities and are electrically conductively connected in each case for instance to a semiconductor layer of the semiconductor body.

The component includes in particular a radiation exit surface or a radiation entrance surface, at which electromagnetic radiation is coupled out from the component or is coupled into the component, for instance. The radiation exit or radiation entrance surface can be formed by the radiation passage surface of the semiconductor body. Alternatively, the radiation exit surface or a radiation entrance surface can be a surface of a radiation-transmissive substrate, for instance of a sapphire substrate, or surface of a protective layer arranged on the semiconductor body.

In accordance with at least one embodiment of the method, a composite carrier is provided. The composite carrier includes for example a carrier layer and an in particular partly cured connecting layer arranged on the carrier layer. A partly cured connecting layer is understood to mean a layer whose material is for instance incipiently dried but not cured.

The composite carrier can be a printed circuit board prepreg. The prepreg includes for example a metal layer for instance in the form of a metal foil as a carrier layer and a connecting layer including a printed circuit board material, for instance. In this case, the connecting layer may include a fiber-reinforced matrix material and is for example a glass-fiber-reinforced resin layer. Alternatively, in order to form the composite carrier, a metal layer, for instance a copper layer in particular in the form of a pure copper foil, can be provided, wherein a connecting layer for instance in the form of an adhesive layer including an adhesive is applied on the metal layer.

In accordance with at least one embodiment of the method, the semiconductor body or a plurality of semiconductor bodies is/are applied on the composite carrier such that the connection location or connection locations at least partly or completely penetrate(s) into the partly cured connecting layer. If the semiconductor body includes a plurality of connection locations on its rear side, the connection locations can likewise be partly or completely embedded into the connecting layer, such that the connection location or connection locations is or are surrounded by the connecting layer fully circumferentially, for instance, in lateral directions.

A lateral direction is understood to mean a direction which runs in particular parallel to a main extension surface of the semiconductor body. A vertical direction is understood to mean a direction which is directed for instance perpendicularly to the main extension surface.

In accordance with at least one embodiment of the method, the connecting layer is completely cured in order to form a solid and for instance permanent composite including the semiconductor body and the composite carrier. That is to say that the semiconductor body can be connected to the carrier layer as a result of the curing of the connecting layer to such a fixed extent that the semiconductor body is separated from the carrier layer for instance only by an irreversible destruction of the connecting layer. The curing can be carried out for example by a thermal treatment. It is thereby possible to prevent the semiconductor body or the semiconductor bodies from becoming indistinct in the subsequent method steps. It is thus possible to use a multiplicity of thermally stable and cost-effective materials for instance for forming a molded body for a housing directly on the semiconductor body, which even under thermal stress maintain the necessary stiffness under high mechanical loading.

In accordance with at least one embodiment of the method, a molded body material, for instance a plastic, is applied on the composite carrier, in particular around the semiconductor body, in order to form a molded body, such that side surfaces of the semiconductor body are covered by the molded body. The molded body material can be an electrically insulating material which can be filled in particular with white particles, for instance with scattering and reflective titanium oxide or silicon oxide particles. The molded body material is applied on the composite carrier for instance on the side of the semiconductor body, such that the connecting layer is situated between the molded body and the carrier layer in the vertical direction. In particular, the molded body material is present in the form of a potting compound which is preferably applied on the composite carrier and around the semiconductor body or around the semiconductor bodies by a molding method in particular under the action of pressure. The molded body material can be applied such that the radiation passage surface remains free of the molded body material, while the side surfaces of the semiconductor chip are at least partly or in particular completely covered by the molded body material. Such a molded body adheres to the side surfaces of the semiconductor body and is mechanically carried for instance by the composite carrier, in particular by the cured connecting layer.

A molding method is generally understood to mean a method by which a molding compound preferably under the action of pressure can be configured in accordance with a predefined shape and if necessary cured. In particular, the term "molding method" encompasses molding, foil assisted molding, injection molding, transfer molding and compression molding.

In accordance with at least one embodiment of the method, a cutout is formed through the carrier layer and the connecting layer in order to expose the connection location, in particular in order to expose a plurality of connection locations. Moreover, a plurality of cutouts can be formed through the carrier layer and the connecting layer in order to expose a plurality of connection locations. The cutout or the cutouts can be filled with an electrically conductive material, such that the electrically conductive material is in an electrical contact with the connection location or with the connection locations. In this case, the electrically conductive material can be identical to a material of the carrier layer or different than said material. In particular, the cutout or the plurality of cutouts is filled with the electrically conductive material such that the conductive material in the cutouts respectively forms a connection column which in particular electrically connects a connection location on the rear side of the semiconductor body to the carrier layer. In particular, the cutout is completely filled, such that the connection column terminates flush with the carrier layer. A solder layer can be applied on the connection column and/or on the carrier layer. The solder layer can subsequently be refined.

A column is generally understood to mean a geometric structure having a vertical height, a lateral width and a lateral cross section, wherein the lateral cross section has a substantially unchanged shape along the vertical direction, that is to say along the height, and wherein an area of the cross section in particular does not change abruptly along the vertical direction. The column in this sense is formed integrally, in particular, and is producible for instance in a single method step. For example, the lateral cross section of the column has the shape of a circle, polygon, ellipse or other shapes. An aspect ratio regarding the height to width can be between 0.1 and 10 inclusive, for instance between 0.3 and 3 inclusive, or more. A geometric structure having abruptly changing areas of the cross section along the vertical direction, for instance having a step on side surfaces of the geometric structure, is often attributable to a composite including two or more partial layers produced in separate method steps, and in case of doubt should not be understood as the column described here.

In accordance with at least one embodiment of the method, the semiconductor body is electrically short-circuited for a short time directly after the cutout or the cutouts has or have been filled. In a subsequent step, it is possible to form an intermediate trench between the filled cutouts such that the electrical short circuit is canceled by the intermediate trench. In particular, the intermediate trench is produced through the carrier layer, such that for instance the connecting layer is exposed in the region of the intermediate trench. The carrier layer can be subdivided into two partial regions by the intermediate trench, wherein the partial regions are assigned to different electrical polarities of the component to be produced. The partial regions of the carrier layer are electrically connected in each case for instance to a connection location on the rear side of the semiconductor body, as a result of which the component to be produced is externally electrically contactable at the rear side, that is to say via a rear side of the carrier layer, and is thus configured as a surface mountable component.

In at least one embodiment of the method for producing one or a plurality of components, one semiconductor body or a plurality of semiconductor bodies is or are provided. The semiconductor body includes a radiation passage surface and a rear side facing away from the radiation passage surface. The semiconductor body includes at the rear side one or a plurality of connection locations for the electrical contacting of the semiconductor body. A composite carrier including a carrier layer and a partly cured connecting layer arranged on the carrier layer is provided. In a subsequent step, the semiconductor body is applied on the composite carrier, such that the connection location or the plurality of connection locations penetrates into the partly cured connecting layer. In order to fix the semiconductor body or the semiconductor bodies, the connecting layer is cured in order to form a solid, for instance permanent, composite including the semiconductor body or semiconductor bodies and the composite carrier. After the curing of the connecting layer, a molded body material is applied on the carrier composite, for instance around the semiconductor body or around the semiconductor bodies, in order to form a molded body, such that side surfaces of the semiconductor body or of the semiconductor bodies are covered by the molded body. In order to produce an electrical contact between the connection location or the connection locations and the carrier layer, at least one or a plurality of cutouts is or are produced through the carrier layer and the connecting layer, such that the connection location or the plurality of connection locations is exposed. The cutout or the plurality of cutouts can be filled with an electrically conductive material, such that the electrically conductive material is in an electrical contact with the carrier layer and the connection location or the plurality of connection locations.

With the use of a partly cured connecting layer, a semiconductor body or a plurality of semiconductor bodies can be applied on the composite carrier and pre-fixed in a simplified manner. As a result of the curing of the connecting layer, a solid and permanent and thus non-temporary composite including the composite carrier and the semiconductor body or semiconductor bodies is formed, such that the semiconductor body or semiconductor bodies is or are completely or almost completely prevented from becoming indistinct for instance in the course of the further process steps.

As a result of the fixing, a molded body material can be molded around the semiconductor body or the plurality of semiconductor bodies in a simplified and reliable manner for example by a molding method, in particular by foil assisted molding. In this case, the molded body material can be a potting material which is highly filled with white particles and which, on account of its low viscosity, can normally be applied on lateral surfaces of the semiconductor body only with a high outlay by a conventional method. A material which is highly filled with white particles is understood to mean a material which includes a matrix material and white particles embedded into the matrix material, wherein the white particles make up at least 60, for instance at least 70 or at least 80, percent by weight or volume of the highly filled material. As a result of the fixing of the semiconductor body or semiconductor bodies, a highly filled material can be applied on lateral surfaces of the semiconductor bodies for forming a molded body by a molding method, preferably by foil assisted molding, without a high outlay. As a result of the fixing of the semiconductor bodies in the connecting layer, in addition potential mechanical weak points that occur in conventional connecting methods such as sintering, adhesive bonding or soldering can largely be avoided. On account of the fixing of the semiconductor bodies by the curing of the connecting layer, which remains in particular on the finished produced component, it is possible to dispense with a thermal transfer film, for example.

In accordance with at least one embodiment of the method, the connecting layer is formed from a fiber-reinforced resin material. In this case, the connecting layer can be clad over the whole area with the carrier layer formed for instance as a metal foil. The composite carrier may include a plurality of such connecting layers and carrier layers. In particular, the composite carrier is a printed circuit board prepreg formed as a composite laminate including at least one partly cured epoxy resin layer having a high Tg value, namely having a glass transition temperature for instance of between 140° C. and 210° C. inclusive or between 150° C. and 210° C. inclusive, preferably between 180° C. and 210° C. inclusive. In particular, the composite carrier is an epoxy resin layer clad with a copper foil over the whole area, the epoxy resin layer being reinforced for instance with glass fibers.

In accordance with at least one embodiment of the method, the molded body is formed from a molded body material highly filled with white particles, for instance, wherein the molded body is preferably formed by foil assisted molding. In particular, the entire semiconductor body is thereby surrounded by the molded body fully circumferentially in lateral directions. It has been found that foil assisted molding is a particularly suitable method for applying highly filled molded body material on a pre-fixed semiconductor body or semiconductor chip.

In accordance with at least one embodiment of the method, the semiconductor body includes on the rear side two electrical connection locations associated with different electrical polarities of the semiconductor body, wherein after the curing of the connecting layer, two cutouts spaced apart laterally from one another are formed through the carrier layer and the connecting layer in order to expose the two connection locations. Said cutouts are filled in particular with an electrically conductive material. In this case, the semiconductor body can be electrically short-circuited directly after the cutouts have been filled. In a subsequent step an intermediate trench can be formed between the filled cutouts such that the electrical short circuit can be canceled by the intermediate trench.

The cutout or the plurality of cutouts can be filled with a material identical to the material of the carrier layer. In particular, the connection location or the plurality of connection locations is formed from copper or coated with copper. The carrier layer can also be formed from copper, wherein the cutout or the plurality of cutouts can likewise be filled with copper. For this purpose, it is possible to employ an electrolytic method for forming the connection locations and/or the carrier layer. Copper constitutes a particularly suitable material for the carrier layer, which can be structured into conductor tracks, for instance. Copper is additionally distinguished by a particularly high thermal conductivity and a particularly low electrical resistance. The use of an identical material, in this case copper, for instance, for the connection locations, the carrier layer and also the connection columns arising as a result of the filling of the cutouts makes it possible to produce a mechanically particularly stable contact structure having a high thermal and electrical conductivity. Possible mechanical weak points for instance such as occur in the substrate-based CSP (Chip-size Package) at the chip-substrate connecting plane thereof do not occur, or hardly occur, with the use of pure copper connections. Moreover, a pure copper connection has a high thermal and electrical conductivity and generally as a one-component composite is less susceptible to customary reliability requirements. Copper is moreover particularly cost-effective in comparison with further high-performance materials such as silver and gold.

In accordance with at least one embodiment of the method, the semiconductor body is provided as part of an unpackaged semiconductor chip having two electrical connection locations on a rear side. In this case, the unpackaged semiconductor chip can be a flip-chip, for instance a sapphire flip-chip, or a semiconductor chip having a plated-through hole extending through the semiconductor layers. In this case, the molded body, the carrier layer and the connecting layer can form a continuous housing for the semiconductor body, such that the component, after the completion thereof, includes a semiconductor body surrounded by the housing. That is to say that the semiconductor body is packaged by the formation of the molded body.

In accordance with at least one embodiment of the method, a plurality of such components are produced. A plurality of semiconductor bodies in the form of a semiconductor body composite for instance in the wafer composite, or in the form of unpackaged semiconductor chips spaced apart laterally can be applied on the composite carrier, such that the connection locations of the semiconductor bodies penetrate into the partly cured connecting layer. Isolation trenches can be produced between the components to be produced in the lateral direction and through the carrier layer in a vertical direction for instance by a mechanical method and/or by laser via drilling. After the electrical contacting of the connection locations with the carrier layer, which in this case in particular is subdivided into partial layers associated with different electrical polarities, the components to be produced can be singulated for instance along the isolation trenches, such that each component includes one of the semiconductor bodies and a housing, wherein the housing is formed from a continuous composite including the singulated molded body, the singulated carrier layer and connecting layer. By such a method, the housing can be produced directly on the semiconductor body, for instance in the wafer composite, or directly on the semiconductor chip.

In this case, the carrier layer can be structured such that the isolation trenches are free of the carrier layer, for instance. During a subsequent singulation step, the components are thus singulated only by the separation of the molded body and/or of the connecting layer and not necessarily by the separation of the carrier layer, with the result that possible metal residues from the carrier layer, for instance copper particles, which may be released during the singulation process, cannot pass in the direction of the radiation passage surface of the components. The molded body can be formed from a migration-impeding material, such that the molded body acts for instance as a barrier layer that prevents a possible migration of copper atoms and copper ions in the direction of the radiation passage surface for example during the operation of the component.

In at least one embodiment of a component, the component includes a semiconductor body and a housing. The housing is formed from a continuous composite including a molded body, a carrier layer and a cured electrically insulating connecting layer. The component includes, on a rear side of the semiconductor body facing the carrier layer, one or a plurality of electrical connection locations for the electrical contacting of the semiconductor body. The electrical connection location or the plurality of electrical connection locations is arranged at least regionally in the connecting layer arranged between the semiconductor body and the carrier layer and is surrounded by the connecting layer in particular fully circumferentially in lateral directions. The connecting layer includes in particular a cured resin layer or a cured adhesive layer. The molded body covers side surfaces of the semiconductor body, wherein in a plan view of the carrier layer the molded body surrounds the semiconductor body fully circumferentially and overlaps the connecting layer.

In particular, the molded body completely overlaps the connecting layer. That is to say that in plan view the connecting layer can completely cover the molded body and thus mechanically carry the molded body in this respect. Moreover, the molded body can completely cover the side surfaces of the semiconductor body. In this case, the molded body terminates flush for instance with the semiconductor body.

In accordance with one embodiment of the component, the semiconductor body includes on the rear side thereof two electrical connection locations, of which a first electrical connection location is electrically conductively connected to a first semiconductor layer of a first charge carrier type of the semiconductor body and a second electrical connection location is electrically conductively connected to a second semiconductor layer of a second charge carrier type of the semiconductor body. In particular, the semiconductor body includes an active layer arranged between the semiconductor layers and configured for instance for emitting or for detecting electromagnetic radiations during operation of the component. In order to improve the current distribution, the semiconductor body may include a plurality of connection locations which are assigned to an identical electrical polarity of the component.

The carrier layer is subdivided in particular into at least two partial regions which are spaced apart laterally from one another and overlap the connecting layer in plan view, wherein the partial regions of the carrier layer are each electrically conductively connected for instance to one of the two connection locations. The partial regions of the carrier layer can in this case each include a connection column extending in the vertical direction in particular through the connecting layer to a connection location. In this case, the partial regions can be electrically isolated from one another by the connecting layer. The connecting layer is for instance arranged partly between the connection locations in the lateral direction and formed integrally, in particular.

The method described above is particularly suitable for the production of a component described here. Features described in association with the method can therefore also be used for the component, and vice versa.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 1 to 7 show various method stages of one exemplary embodiment of a method for producing one or a plurality of components in schematic sectional views.

DETAILED DESCRIPTION

Figure 4:
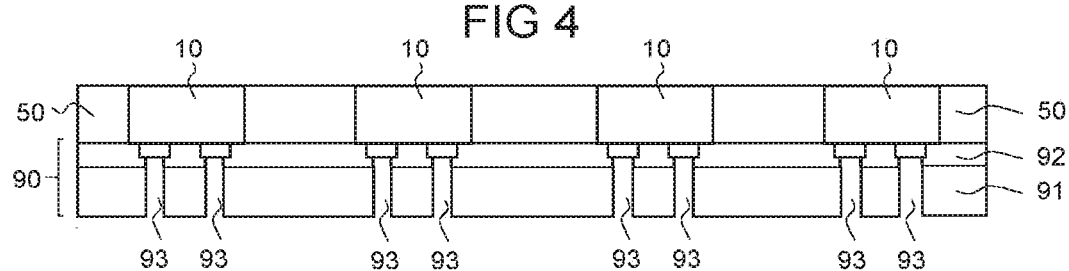

Elements that are identical, of identical type or act identically are provided with identical reference signs in the figures. The figures are in each case schematic illustrations and therefore not necessarily true to scale. Rather, comparatively small elements and in particular layer thicknesses may be illustrated with an exaggerated size for clarification.

FIGS. 1 to 7 illustrate various method stages of one exemplary embodiment of a method for producing a plurality of components 100 in schematic sectional views.

In FIG. 1, a composite carrier 90 is provided. The composite carrier 90 includes a carrier layer 91, which is formed for instance as a metal layer, preferably as a metal foil, and a connecting layer 92 arranged on the carrier layer 91. The connecting layer 92 includes in particular a partly cured connecting material. The connecting layer 92 is initially formed in particular as viscose, preferably pasty and moldable. By way of example, the connecting layer 92 may include an adhesive. Moreover, the connecting layer 92 can be a printed circuit board material including a plastics matrix material reinforced with fibers, preferably with glass fibers, for instance. The composite carrier 90 can also be formed with 3 layers, 4 layers or in a multilayered fashion. In this case, the connecting layer 92 is formed in an electrically insulating fashion. The carrier layer 91 is formed in an electrically conductive fashion and includes in particular a metal, for instance copper.

The carrier layer 91 can be provided in this case as a copper layer, in particular as a copper foil, wherein the connecting layer 92 can be formed by applying an adhesion promoter, for example an adhesive, on the carrier layer 91 for example with the aid of a coating method.

Alternatively, the composite carrier 90 is provided as a printed circuit board prepreg. The prepreg includes a metal layer, for instance in the form of a copper foil, formed as the carrier layer 91, and an electrically insulating layer composed of a resin material, for instance, formed as the connecting layer 92. By way of example, the prepreg includes a connecting layer 92 composed of a partly cured high-Tg epoxy resin which is clad for instance over the whole area in particular with the carrier layer 91 composed of a metal such as copper, for example. In this case, the metal layer can be a copper foil having a vertical thickness of between 18 µm and 250 µm, for example. In this case, Tg denotes a glass transition temperature at which the epoxy resin microstructure becomes soft and extensible upon attaining this temperature. A high-Tg value is understood to mean in particular a temperature of between 140° C. and 210° C., for instance between 150° C. and 210° C. inclusive, or between 180° C. and 210° C. inclusive. Preferably, the connecting layer 92 has a Tg of greater than or equal to 180° C., such that the connecting layer 92 does not soften for instance when the molded body material is applied, for example by molding, in the course of which the temperature can be up to 180° C.

In accordance with FIG. 2, a plurality of semiconductor bodies 10 are applied on the composite carrier 90. The semiconductor body 10 includes a radiation passage surface 11 and a rear side 12 facing away from the radiation passage surface. The radiation passage surface 11 can be formed by a surface of a substrate 9, for instance of a growth substrate 9 or by a surface of a semiconductor layer 2. The semiconductor body 10 includes on the rear side 12 connection locations 70 for the electrical contacting of the semiconductor body 10. In this case, the connection locations 70 can be parts of connection layers which can extend into the semiconductor body 10.

By way of example, the semiconductor body 10 includes a first connection location 71, which is electrically conductively connected to a first semiconductor layer 1 of the semiconductor body, and a second connection location 72, which is electrically conductively connected to a second semiconductor layer 2 of the semiconductor body 10. The semiconductor body 10 additionally includes an active layer 3, which is arranged between the first semiconductor layer 1 and the second semiconductor layer 2 and is configured for emitting or detecting electromagnetic radiations in visible, ultraviolet or infrared spectral ranges during operation of the component. The radiation passage surface 11 can be unstructured or structured in order to increase the efficiency of coupling radiation in or out. The connection locations 70, 71 and 72 can be formed from copper or coated with copper.

The semiconductor body 10 can be formed as part of an unpackaged semiconductor chip. An unpackaged semiconductor chip is in particular free of a housing that laterally surrounds the semiconductor body. Moreover, the unpackaged semiconductor chip can be free of a carrier that differs from the growth substrate. Alternatively, it is possible to arrange the semiconductor body 10 of an unpackaged semiconductor chip on a carrier substrate 9 on a growth substrate 9. The unpackaged semiconductor chip can be a sapphire flip-chip. It is also possible for the growth substrate to be removed from the semiconductor body in a further method step, such that the component 100 is free of a growth substrate.

The unpackaged semiconductor chip can be a flip-chip in which the first semiconductor layer 1 and the active layer 3 are partly removed in order to expose the second semiconductor layer 2 and the second connection location 72 is electrically conductively connected to the second semiconductor layer 2 at an exposed surface. Alternatively, the unpackaged semiconductor chip may include a connection location formed as part of a connection layer in the form of a plated-through hole, wherein the plated-through hole extends through the first semiconductor layer 1 and the active layer 3 to the second semiconductor layer 2 and is thus electrically connected to the second semiconductor layer 2. The second connection location 72 and/or the connection layer in this case can be enclosed by the first semiconductor layer 1 and by the active layer 3 fully circumferentially in lateral directions and can be electrically insulated from these layers by an insulation layer.

The semiconductor bodies 10 are applied on the composite carrier 90, such that the connection locations 70 penetrate into the partly cured connecting layer 92 of the composite carrier 90, as a result of which the semiconductor bodies 10 are pre-fixed on the composite carrier 90. As a result, an interspace situated between the connection locations 70 in the lateral direction can be partly or completely filled with a material of the connecting layer 92.

In a further method step, the connecting layer 92 is cured for instance by a thermal treatment in order to form a solid, in particular permanent, composite including the semiconductor bodies 10 and the composite carrier 90. Particularly in the case of a printed circuit board material such as epoxy resin reinforced with fibers, in particular with glass fibers, a permanent mechanical connection between the semiconductor bodies 10 and the composite carrier 90 is produced by the curing of the connecting layer 92, wherein after curing the semiconductor bodies 10 can be separated from the carrier layer 91 for instance only by the connecting layer 92 being destroyed. After the curing of the connecting layer 92, the positions of the semiconductor bodies 10 on the composite carrier 90 are thus fixed permanently and in particular in a manner that can no longer be altered.

In FIG. 3, after the semiconductor bodies 10 have been fixed, a housing material, for instance in the form of a potting compound for producing a molded body 50, is applied on the composite carrier 90 for example by a molding method, such that the molded body 50 partly or completely covers side surfaces of the semiconductor bodies 10. In particular, interspaces between the semiconductor bodies 10 are filled with the molded body material. In this case, the molded body material can be a molded body material filled with scattering or reflective particles. In particular, the molded body material can be highly filled with the particles. The particles can thus make up for instance at least 60, for example at least 70 or 80% of the total weight or total volume of the molded body material. Such molded body material highly filled with scattering or reflective particles, without the semiconductor bodies 10 being fixed, can be applied on side surfaces of the semiconductor bodies 10 only with great outlay owing to the low viscosity and low adhesiveness of the molded body material. As a result of the semiconductor bodies 10 being fixed before the molded body 50 is formed, a molded body material highly filled with scattering or reflective particles, for instance, can be applied on the composite carrier 90 in a simplified manner for example by foil assisted molding, such that the molded body material for forming the molded body 10 can readily adhere to the side surfaces of the semiconductor bodies 20.

In FIG. 4, a plurality of cutouts 93 are formed in each case through the carrier layer 91 and the connecting layer 92 in order to expose the connection locations 70. In other words, the cutouts 93 each have a bottom surface formed by a surface of the connection location 70. In a departure from FIG. 4, it is also possible merely to form a common cutout 93 in order to expose for instance two or more connection locations 70 of a semiconductor body 10 that are assigned to the different electrical polarities. That is to say that the connection locations 70 of a semiconductor body 10 can be exposed in the common cutout 93.

Figure 5:
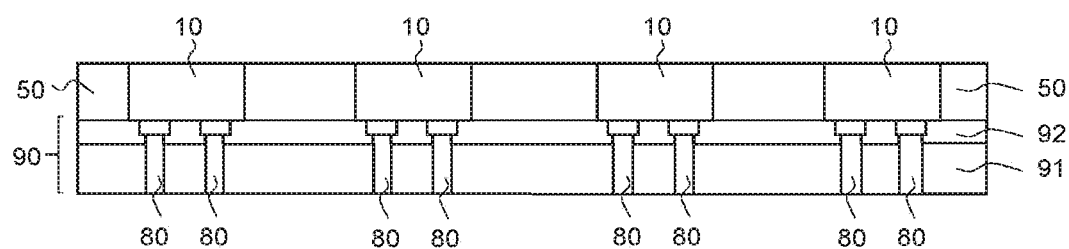

In FIG. 5, the cutouts 93 are filled in each case with an electrically conductive material in order to form a plurality of connection columns 80. In this case, the cutouts 93 can be filled with a material identical to a material of the carrier layer 91. By way of example, the carrier layer 91 can be formed from copper. In particular, the cutouts 93 can be filled with copper. Moreover, the cutouts 93 can be filled with a material that differs from the material of the carrier layer 91. Directly after the cutouts have been filled, the semiconductor body 10 or the plurality of semiconductor bodies 10 can be electrically short-circuited since the connection columns 80 formed in the cutouts 93 adjoin the carrier layer 91 and can thus be electrically connected thereto. In the case of a common cutout 93 in which both connection locations 70 of a semiconductor body 10 are exposed, the common cutout 93 can be filled for example with the aid of a separating structure or a mask such that the connection columns 80 which are associated with the different connection locations 70 and are formed in the common cutout 93 are electrically insulated from one another, as a result of which the semiconductor body 10 is not electrically short-circuited directly after the common cutout 93 has been filled.

Figure 6:
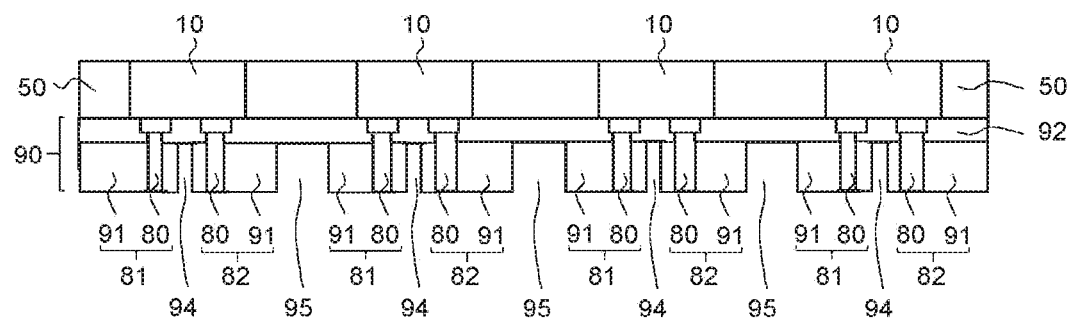

In FIG. 6, a plurality of intermediate trenches 94 are formed, wherein the intermediate trenches 94 are formed in each case between two filled cutouts 93 of a semiconductor body 10. In particular, the connecting layer 92 is exposed in the regions of the intermediate trenches 94. A possible electrical short circuit of the respective semiconductor body 10 can be canceled as a result.

In accordance with FIG. 6, moreover, a plurality of isolation trenches 95 are produced, wherein the isolation trenches 95 extend through the carrier layer 91 in particular as far as or into the connecting layer 92. In the lateral direction the isolation trenches 95 are formed in each case between two components 100 to be produced or between two series of components 100 to be produced. The components 100 can be singulated along the isolation trenches 95 in a subsequent method step, such that each component 100 includes one of the semiconductor bodies 10 and a housing 20, wherein the housing 20 is formed from a continuous composite including the singulated molded body 50, the singulated carrier layer 91 and the singulated connecting layer 92.

The cutouts 93, the intermediate trenches 94 and the isolation trenches 95 can be formed by a printed circuit board process, for example. In this case, the printed circuit board process may include for example processes which are used in the production of HDI (high density interconnect) printed circuit boards. In this case, the cutouts 93 and/or trenches 94 and 95 in the carrier layer 91 can be produced by a mechanical method, for instance by drilling and/or by a laser method. In particular, the cutouts 93 are opened for instance as far as the connecting layer 92 by a mechanical method, whereupon the cutouts 93 are deepened further for instance by a laser method, for instance by laser drilling, until the connection locations 70 are exposed at least in places in the respective cutouts. Laser drilling is a particularly suitable method for producing such cutouts since the cutouts 93 can be produced in a highly targeted and precise manner with regard to their positions and sizes and in a very short time by this method. It has additionally been found that copper layers can serve as particularly suitable stop layers during laser drilling. The connection locations 70 are therefore preferably formed from copper or consist thereof.

The isolation trenches 95 are formed in particular such that the isolation trenches 95 extend only through the carrier layer 91 and not through the connecting layer 92 or the molded body 50. During singulation into a plurality of semiconductor components 100, therefore, only the molded body 50 and/or the connecting layer 92 are/is separated along the isolation trenches 95, thereby preventing possible metal residues, for instance copper residues from the carrier layer 91, from being able to pass in the direction of the semiconductor body 10.

The cutouts 93, the intermediate trenches 94 or the isolation trenches 95 can each include an inner wall having separating traces. In particular, all inner walls of the trenches 93, of the intermediate trenches 94 and/or of the isolation trenches 95 can have separating traces. Separating traces are understood to mean traces for instance on the inner wall of the respective cutout which arose for instance during the formation of the cutout. Such traces can be characteristic traces of a corresponding processing process. The separating traces can additionally be present in the form of grooves filled with electrically conductive material or severed glass fiber bundles on the inner wall of the cutout.

Figure 7:
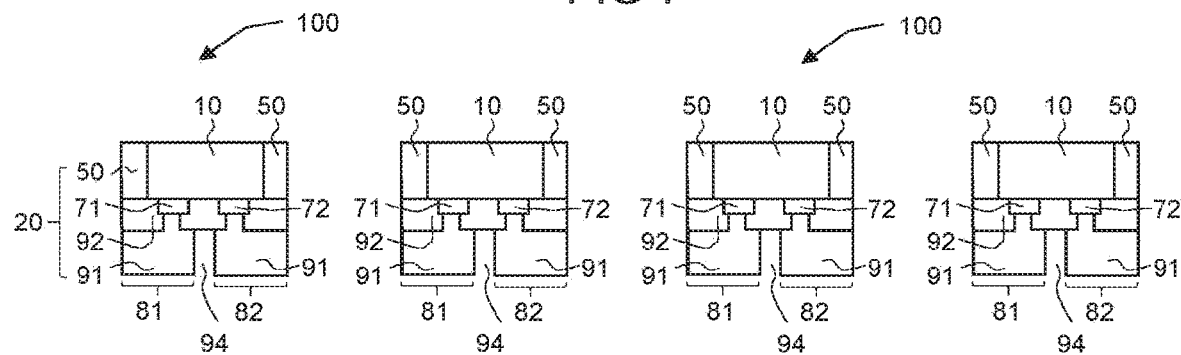

FIG. 7 illustrates a plurality of singulated components 100 in particular in the form of CSPs (chip-size packages). Each component 100 includes a semiconductor body 10 and a housing 20, wherein the semiconductor body 10 is surrounded by the housing 20 fully circumferentially in lateral directions. In particular, the side surfaces of the semiconductor body 10 are completely covered by the molded body 50 of the housing 20. In a plan view of the carrier layer 91, the molded body 50 at least partly overlaps the connecting layer 92. In particular, in a plan view of the carrier layer 91, the molded body 50 completely overlaps the connecting layer 92 and/or completely overlaps the carrier layer 91. The molded body 50 is thus mechanically carried by the connecting layer 92 and/or by the carrier layer 91.

In the vertical direction, the molded body 50 terminates flush in particular with the semiconductor body 10. In FIG. 7, the molded body 50 terminates both with the connecting layer 92 and with the carrier layer 91 in the lateral direction. The carrier layer 91 of the housing 20 is subdivided for instance into a first partial region 81 and a second partial region 82, wherein the partial regions 81 and 82 are spatially separated from one another by an intermediate trench 94 in the lateral direction. In this case, the partial regions 81 and 82 each include one or a plurality of connection columns 80 and extend in particular through the connecting layer 92 to a first connection location 71 and to a second connection location 72, respectively, in order to form in each case an electrical contact with the respective connection location 71 and 72. The connection locations 71 and 72 each have a connecting plane with the carrier layer 91, wherein the connecting plane is situated within the connecting layer 92, that is to say not at an edge or on a surface of the connecting layer 92. The connection columns 80 such as are illustrated in FIG. 5 are not illustrated in FIG. 7.

In plan view the connecting layer 92 overlaps both the first partial region 81 and the second partial region 82 of the carrier layer 91. In particular, the connecting layer 92 includes an intermediate region arranged between the first connection location 71 and the second connection location 72 in the lateral direction, wherein the intermediate region of the connecting layer 92 in plan view laterally bridges the intermediate trench 94 and in this case covers for instance a large portion of the intermediate trench, in particular the complete intermediate trench 94. By virtue of this intermediate region of the connecting layer 92, the component 100 is free of a mechanical weak point in particular at the location of the intermediate trench 94, as a result of which the component 100 overall is formed in a particularly mechanically stable fashion.

Figure 8:
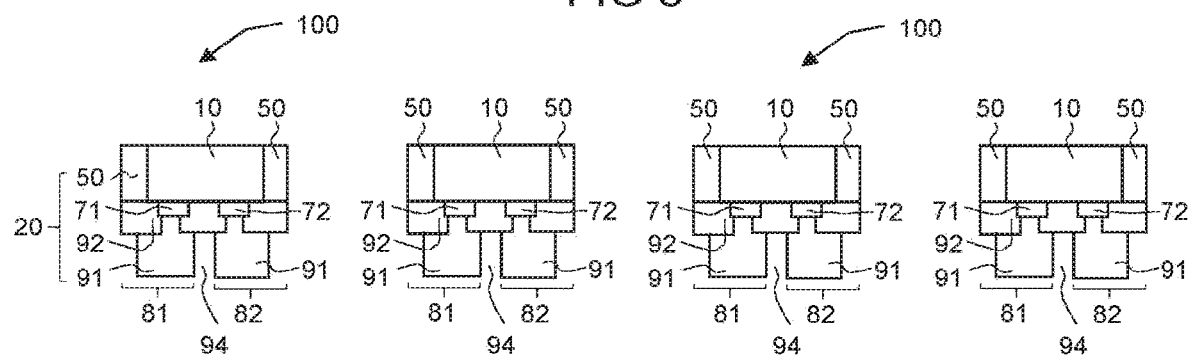
FIGS. 8 to 11 show further exemplary embodiments of a method for producing one or a plurality of components in schematic sectional views.

FIG. 8 illustrates a plurality of singulated components in accordance with a further exemplary embodiment of a method for producing a plurality of components 100 in sectional view. This exemplary embodiment substantially corresponds to the exemplary embodiment illustrated in FIG. 7. In contrast thereto, the housing 20 has a side surface having a step, wherein the step is formed by the connecting layer 92 and the carrier layer 91. In this case, the connecting layer 92 projects beyond the carrier layer 91 in the lateral direction. In plan view the partial regions 81 and 82 of the carrier layer 91 are completely covered by the connecting layer 92 and the semiconductor body 10 together. This makes it possible to ensure that the carrier layer 91 is not severed during singulation into a plurality of components 100, as a result of which the risk of a deposition of metal residues, in particular copper residues, for instance on the radiation passage surface is largely prevented. Moreover, a possible migration of copper atoms or copper ions in the direction of the radiation passage surface for instance during operation of the component can be minimized as a result. A risk for instance regarding copper contamination can thus be minimized.

Figure 9:
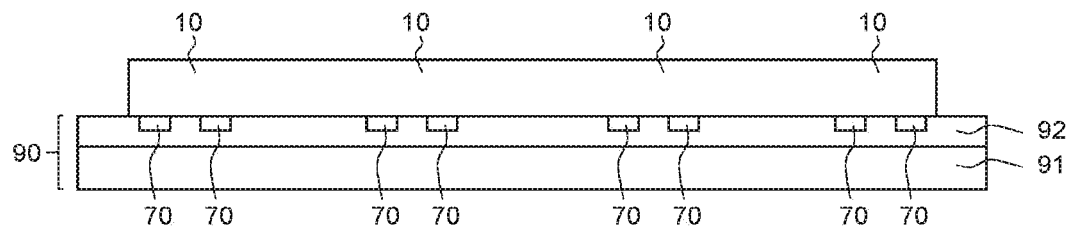
Figure 10:
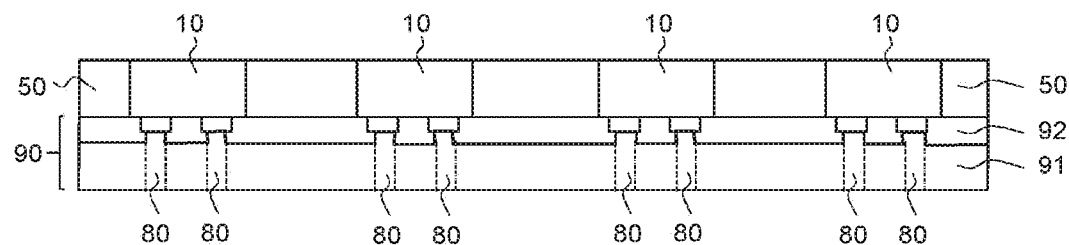

The exemplary embodiment illustrated in FIG. 9 substantially corresponds to the exemplary embodiment illustrated in FIG. 2. In contrast thereto, the plurality of semiconductor bodies 10 is applied in the form of a common semiconductor composite on the composite carrier 90. In a subsequent step, the semiconductor composite is structured into a plurality of semiconductor bodies 10 arranged alongside one another. In FIG. 10, interspaces between the semiconductor bodies 10 that arose as a result of the structuring are filled or potted with a molded body material. The exemplary embodiment illustrated in FIG. 10 substantially corresponds to the exemplary embodiment illustrated in FIG. 5 for a method for producing a plurality of components 100.

Figure 11:
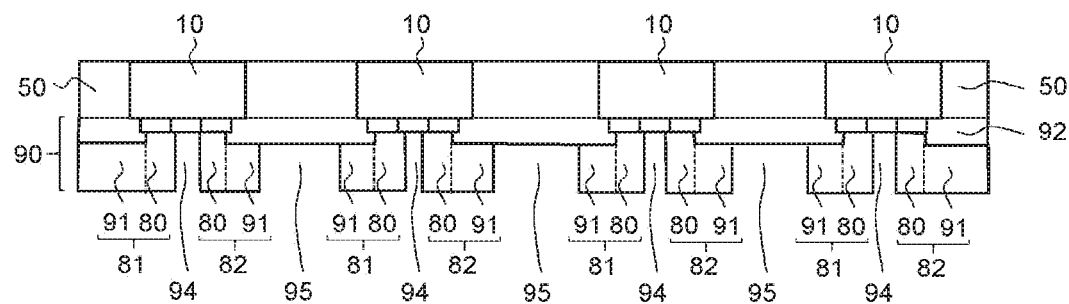

The exemplary embodiment illustrated in FIG. 11 substantially corresponds to the exemplary embodiment illustrated in FIG. 6. In contrast thereto, it is clarified that the two connection locations 70 of the respective semiconductor body 10 can be exposed by a common cutout 93, wherein, in a subsequent method step, the common cutout 93 can be filled for example by a mask or a separating structure such that two connection columns 80 spatially separated from one another can be formed. In this case, the connection columns 80 can be spaced apart laterally from one another by an intermediate trench 94, which is for instance part of the common cutout 93, wherein the connection columns 80 are each electrically conductively connected for instance to one of the connection locations 70 on the rear side 12 of the semiconductor body 10.

The formation of a solid instead of temporary composite including the semiconductor body and the composite carrier before the semiconductor body is packaged allows the use of mechanically stable and high-temperature-stable housing materials for a housing for the semiconductor body, in particular the use of a housing material which is highly filled with impurity particles and which can be applied on the semiconductor body efficiently and without great outlay for instance by foil assisted molding.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

What is claimed is:

1. A component comprising a semiconductor body and a housing,
   wherein
   the housing is formed from a continuous composite comprising:
   a molded body,
   a composite carrier arranged substantially flush with the molded body, wherein the composite carrier comprises a carrier layer and a cured electrically insulating connecting layer, wherein the electrically insulating connecting layer directly contacts a rear side of the semiconductor body,
   an electrical connection location for electrical contacting of the semiconductor body on the rear side of the semiconductor body facing the carrier layer,
   the electrical connection location is arranged in the electrically insulating connecting layer and is surrounded by the electrically insulating connecting layer fully circumferentially in lateral directions,
   the molded body covers side surfaces of the semiconductor body, wherein in a plan view of the carrier layer the molded body surrounds the semiconductor body fully circumferentially and overlaps the composite carrier,
   the semiconductor body comprises a radiation passage surface on a side of the semiconductor body opposite to the rear side of the semiconductor body;
   wherein the molded body is absent from the radiation passage surface.

2. The component as claimed in claim 1,
   wherein the semiconductor body comprises on the rear side two electrical connection locations, of which a first electrical connection location is electrically conductively connected to a first semiconductor layer of a first charge carrier type of the semiconductor body and a second electrical connection location is electrically conductively connected to a second semiconductor layer of a second charge carrier type of the semiconductor body, wherein the carrier layer is subdivided into two partial regions, which are spaced apart from one another laterally, and overlap the electrically insulating connecting layer in plan view and are electrically connected in each case to one of the two connection locations.

3. The component as claimed in claim 2, wherein the two partial regions of the carrier layer each comprise a connection column.

4. The component as claimed in claim 3, wherein an intermediate trench is formed between the two connection columns.

5. The component as claimed in claim 4, wherein the intermediate trench exposes the electrically insulating connecting layer.

6. The component as claimed in claim 1,
wherein the molded body in plan view overlaps the electrically insulating connecting layer and is mechanically carried by the electrically insulating connecting layer.

7. The component as claimed in claim 1,
wherein the connection location is formed from copper or coated with copper and the carrier layer is formed from copper, wherein the electrical connection location and the carrier layer extend into the electrically insulating connecting layer in order to form an electrical contact.

\* \* \* \* \*